United States Patent [19]

Blümel et al.

[11] Patent Number: 5,262,676
[45] Date of Patent: Nov. 16, 1993

[54] SWITCHING SYSTEM DEVELOPED AS MODULE HAVING AT LEAST ONE SEMICONDUCTOR SWITCH FOR SWITCHING A LOAD

[75] Inventors: Thomas Blümel, Schmitten; Joachim Meicher, Hofheim; Bernhard Lukas, Raunheim; Walter Kares, Frankfurt, all of Fed. Rep. of Germany

[73] Assignee: VDO Adolf Schindlling A.G., Frankfurt, Fed. Rep. of Germany

[21] Appl. No.: 766,581

[22] Filed: Sep. 27, 1991

[30] Foreign Application Priority Data

Oct. 31, 1990 [DE] Fed. Rep. of Germany ....... 4034569

[51] Int. Cl.⁵ .................................................. B60L 1/00
[52] U.S. Cl. ................................. 307/10.1; 307/125; 307/139
[58] Field of Search ................... 307/9.1, 10.1, 126, 307/117, 125, 134, 139

[56] References Cited

U.S. PATENT DOCUMENTS

| | | | |
|---|---|---|---|
| 4,114,047 | 9/1978 | Melocik | 307/9.1 |
| 4,349,077 | 9/1982 | Sekiguchi et al. | 307/10.1 |
| 4,809,121 | 2/1989 | Nehls | 307/10.1 |

Primary Examiner—Jeffrey A. Gaffin
Attorney, Agent, or Firm—Martin A. Farber

[57] ABSTRACT

A switching system includes a module having at least one semiconductor switch for switching current to a load, in particular, a setting member in an automotive control or automatic control device. A short-circuit current monitoring circuit and an idle current monitoring circuit are provided for each semiconductor switch. Each switch may constructed as a multiple-emitter transistor with separate emitter terminals being connected to the respective monitoring circuits whereby load current in the multiple-emitter transistor can be monitored. The short-circuit monitoring circuit outputs a signal indicating excessively large load current in the transistor. The idle monitoring circuit outputs a signal indicating excessively small load current in the transistor.

14 Claims, 2 Drawing Sheets

SWITCHING SYSTEM DEVELOPED AS MODULE HAVING AT LEAST ONE SEMICONDUCTOR SWITCH FOR SWITCHING A LOAD

FIELD AND BACKGROUND OF THE INVENTION

The present invention relates to a switching system constructed as a module and having at least one semiconductor switch for switching a load, particularly for operation of a setting member in control or automatic control devices.

Control or automatic control devices are frequently composed of individual modules which are in most cases developed as integrated circuits. One control device of particular interest herein is in the form of an electric circuit in an automobile for driving electric current in the inductive load presented by the coil of a fuel injector valve in an engine. For this purpose there are known, for instance, so-called driver modules in which one or more output stages for the switching of loads are present. In electronic systems for motor vehicles such driver modules are used, for instance, for switching injection valves, for tanker regeneration and for the return of the exhaust gas.

In control and automatic control devices which perform safety or exhaust-relevant functions, an extensive diagnosis of faults which might possibly occur is necessary. In order to support such a diagnosis, driver modules are known which, via a single connection, give off a common error report upon the occurrence of various faults or errors. Therefore, one cannot determine which error has occurred.

SUMMARY OF THE INVENTION

The object of the present invention is to provide a switching system constructed as a module and having at least one semiconductor switch for switching a load, wherein different error reports are issued in the event of a short circuit current or in the event of insufficient idling current.

According to the invention, for each semiconductor switch (2) there is provided a short-circuit monitoring circuit (21-26) and an idle monitoring circuit (13-19) each having an output connection (26, 18).

In most uses of the switching system of the invention, the current is applied in pulsating fashion to an inductive load, the current gradually increasing within each conductive phase of the semiconductor switch.

In order not to receive an error report at the commencement of a conductive phase and, therefore, when there is only very little current, it is provided, in accordance with a further feature of the invention, that upon a pulsating control of the semiconductor switch (2) the idle monitoring circuit (13-19) output a signal having a value which indicates idling if the current through the semiconductor switch (2) remains below a predetermined value during an entire conductive phase of the semiconductor switch (2).

One advantageous embodiment of the switching arrangement of the invention provides that the idle monitoring circuit comprises of a first threshold-value circuit (13), a first low pass filter (14) and a first flip-flop (15), and that the short-circuit monitoring circuit comprises a second threshold value circuit (21), a second low pass filter (22) and a second flip-flop (24).

According to a feature of the invention, the first flip-flop (15) can be reset by the output signal of the first low pass filter (14) and be set by an applied pulse control signal, and that an output signal of the first flip-flop (15) is combined with the control signal in order to form an output signal of the idle monitoring circuit.

Still further according to the invention, the second flip-flop (24) can be set by the output signal of the second low pass filter (22), and be clock-controlled by an applied pulse control signal and an output signal of the second flip-flop (24) serves as an output signal of the short-circuit monitoring circuit.

In this connection, for the rapid disconnecting of the semiconductor switch in the event of a short circuit, the output signal of the second threshold value circuit (21) controls a feeding of a control signal to the control electrode of the semiconductor switch (2). Since, however, the control signal is again fed to the control electrode of the semiconductor switch due to a then occurring absence of current through the semiconductor switch, no final disconnection takes place in this case. This can only be obtained in the manner that, in accordance with a further aspect of the invention, another output signal of the second flip-flop (24) controls a feeding of the control signal to the control electrode of the semiconductor switch (2). In this way, the semiconductor switch remains in non-conductive condition until the disconnecting of the operating voltage.

Another development of the invention consists therein that a temperature sensor (30) is provided in the module (11), the output signal of the sensor so controlling the short-circuit monitoring circuits (21-26, 21'-26') that when a predetermined temperature is exceeded, the outputs (26, 26') of the short-circuit monitoring circuits (21-26, 21'-26, 21'-26') output the value intended for a short circuit. In this way a short circuit is reported for all semiconductor switches provided in a module. Since simultaneous short circuits on all outputs are, however, very improbable, such an error report is considered to mean thermal overloading.

According to another feature of the invention the semiconductor switch (2) is a multi-emitter transistor, one emitter being connected to ground and two other emitters being connected respectively with an input of the short-circuit monitoring circuit (21-26) and the idle monitoring circuit (13-19).

Another feature of the invention provides for a switch input (34) and that, as a function of a switch voltage which can be fed to the switch input (34), the switching arrangement is adapted to different, and preferably two different, load ranges.

Due to this development a module of the same dimensions can be used in different load ranges, in which connection different parameters, for instance the threshold values in the case of the short circuit and idle monitoring circuits, the amplitude of the control signal for the semiconductor switch, and a limiting of the voltage on the semiconductor switch, can be adapted to the specific purpose of use. For this purpose, a connection of the switch input with a suitable potential is merely to be provided or omitted in the circuit board receiving the module.

Further according to a feature of the invention, the amplitude of a control signal which can be fed to the control electrode of the semiconductor switch (2) is dependent on the switch voltage.

Still further according to the invention, threshold values to which the short circuit monitoring circuit (21-26) and the idle monitoring circuit (13-19) respond are dependent on the switch voltage.

Yet further by the invention a limiting of the voltage on the semiconductor switch (2) is dependent on the switch voltage.

BRIEF DESCRIPTION OF THE DRAWING

With the above and other objects and advantages in view, the present invention will become more clearly understood in connection with the detailed description of preferred embodiments, when considered with the accompanying drawing, of which.

DETAILED DESCRIPTION OF THE PREFERRED EMBODIMENT

Figure 1:
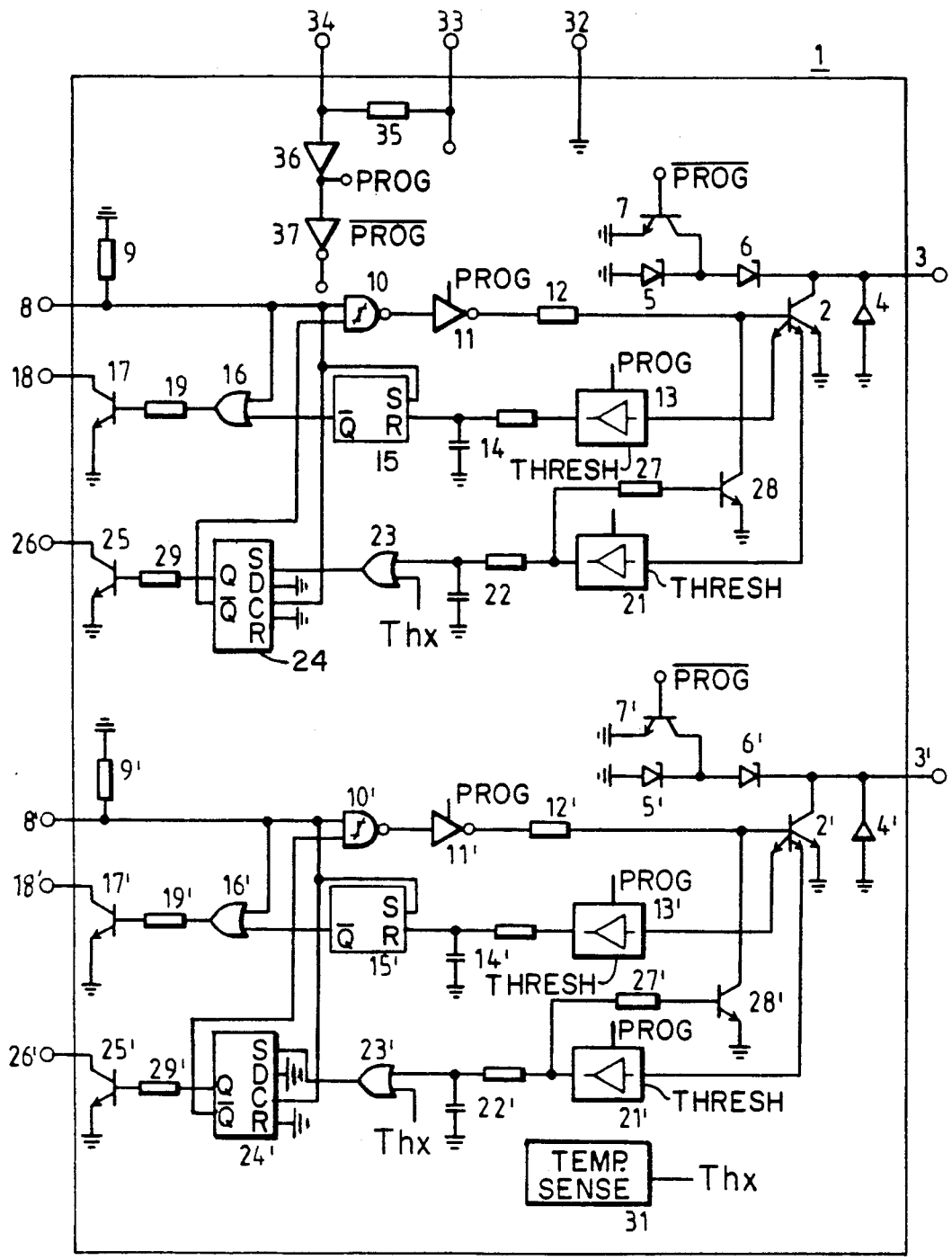
FIG. 1 is a block diagram of the embodiment.

In the figures, identical parts have been provided with the same reference numbers. The module 1 shown in FIG. 1 contains two identical circuits each having a semiconductor switch which is suitable as output stage (driver), for example, for different setting members in a motor vehicle and the circuits associated in each case with the semiconductor switch. In the following, therefore, only the circuit bearing the reference Nos. 2-29 will be described while the elements of the other circuit are provided with the reference Nos. 2' to 29' are understood to function in the same fashion.

The output stage is formed by a multi-emitter transistor 2, one emitter of which is connected to ground and the collector of which is connected to an output 3. Since the switching arrangement is intended essentially for the switching of inductive loads, a reverse-terminal protection diode 4 and free-wheeling zener diodes 5, 6 are connected in parallel to the transistor 2, the series-connected zener diodes 5, 6 furthermore providing protection against overvoltages for the transistor 2. By bridging the zener diode 5 by a transistor 7 the limiting voltage can be reduced.

A control signal for the transistor 2 is fed via an input 8 which is connected to ground via an input resistor 9. The control signal passes via a NAND gate 10, inverting amplifier 11, the amplification of which is adjustable, and a resistor 12 to the base of the transistor 2.

In order to recognize errors in the region of the output 3, an idle monitoring circuit and a short-circuit monitoring circuit are provided. The idle monitoring circuit responds when the current through the transistor 2 is below a predetermined threshold and when, therefore, an interruption in the line is present between the collector of the transistor 2, the load, within the load or between the load and the positive operating voltage. Furthermore, the idle monitoring circuit responds upon a short circuit of the output 3 with respect to ground.

The short-circuit monitoring circuit responds when the current through the transistor 2 exceeds another predetermined value which is the case essentially upon a connection between the output 3 or the line to the load on the one hand and the positive terminal of the source of operating voltage on the other hand.

The idle monitoring circuit is formed by a threshold value circuit 13, a low pass filter 14, a flip-flop 15, an OR gate 16 and an output transistor 17. From one output 18 there can be taken a signal which indicates idling.

The threshold value circuit 13 produces an output signal which is positive when a predetermined value of the current through the transistor 2 is exceeded. This predetermined value lies below the current to be expected for the load in question, in which connection tolerances of the individual loads and variations in time and temperature are to be taken into account. Brief disturbances are suppressed by the low pass filter 14 which has for instance a time constant of 200 μs.

The flip-flop 15 is set with the commencement in each case of a control pulse which brings the transistor 2 into the conductive state. The value L (low voltage) is then present at the output $\overline{Q}$. Due to the OR connection at gate 16, with the control signal, which at this time has a value of H (high voltage), there is produced at the output of the OR gate 16 also a positive signal H which, via the resistor 19, places the transistor 17 into conductive state. The output 18 thus receives the level L.

If the current rises above the threshold value during the conductive phase of the transistor 2, which takes place in case of disturbance-free operation also in the case of inductive loads, the flip-flop 15 is reset. At the end of the conductive phase, the control signal assumes the value L so that as a result of the OR connection at gate 16 the signal at the output 18 is dependant on the level at the output $\overline{Q}$. Since the flip-flop 15 has been reset, the level H is present at the output $\overline{Q}$ so that the transistor 17 continues to be conductive and the level L prevails at the output 18.

However, if the current through the transistor 2 has not exceeded the predetermined value during the conductive phase, the flip-flop 15 remains set so that the output $\overline{Q}$ continues to have the level L. This leads to a blocking of the transistor 17 so that the level L is outputted at the output 18 as error report.

A short-circuit monitoring circuit consists of a threshold value circuit 21, a low pass filter 22, an OR gate 23, a flip-flop 24, and an output transistor 25 connected by resistor 29 to flip-flop 24, the collector of the transistor 25 serving as an output 26. The output signal of the threshold value circuit 21 jumps to a positive value if the current through the transistor 2 exceeds a value which lies above the currents to be expected upon normal operation. The low pass filter 22 serves to suppress brief disturbances. In order to counteract overloading of the transistor 2 as promptly as possible, the base of a transistor 28 is connected to the output of the threshold value circuit 21 via a resistor 27, the resistor 27 connecting the base of the transistor 28 to ground in the event of a short circuit and thus preventing further control. In this way, the current is limited to a value at which the transistor 2 is still not overloaded, and which current value is sufficient to set the flip-flop 24 which is clocked by the control signals.

By the setting of the flip flop 24, the transistor 25 which is connected via the resistor 29 with the output $\overline{Q}$ of the flip-flop 24 becomes conductive so that, in the event of a short circuit, the output 26 assumes the level L. At the same time, due to the connection of the output $\overline{Q}$ of the flip-flop 24 with the NAND gate 10, further feeding of the control signals to the transistor 2 is prevented until the control signal at the input 8 again changes from level L to level H and the flip-flop 24 is thus again reset.

In the module 1 there is furthermore provided a temperature sensor 31 which gives off a signal Thx which assumes the level H when a permissible value of temperature is exceeded. This signal is fed to the OR gates 23, 23' and thus produces a short-circuit error report in both circuits. Since a simultaneous short circuit of both outputs 3, 3' is extremely improbable, a connected microcomputer can recognize from this that with high probability a thermal overload is present.

Via a connection 32 the module 1 can be connected to ground potential or with the negative terminal of the source of operating voltage. A connection 33 serves to feed the positive operating voltage. By means of another connection 34, the module can be switched for two different load ranges. The connection 34 can be acted on by the positive operating voltage via a resistor 35.

If the module 1 is used in a control device with low loads, the connection 34 is connected to ground potential. In the case of control devices with high loads, the connection 34 remains without further connection. Via a non-inverting amplifier 36, the switch voltage PROG fed at 34 is fed to a control input of the amplifier 11 and control inputs of the threshold value circuits 13, 21. Via an inverting amplifier 37 the inverted switch voltage PROG passes to the base of the transistor 7. By the control of the amplifier 11 it is possible to adapt the base current of the transistor 2 to the corresponding load and therefore to the maximum current. In this way, an unnecessarily high base current in the case of smaller loads is avoided. The control of the threshold value circuits 13, 21 permits adaptation of the threshold values to the specific loads present. The switching of the voltage limitation can, for instance, be developed in such a manner that in the case of automotive fuel injection valves, which have a relatively high return voltage, the limitation is effected at 80 V and, in the case of other loads, at 27 V.

Figure 2:
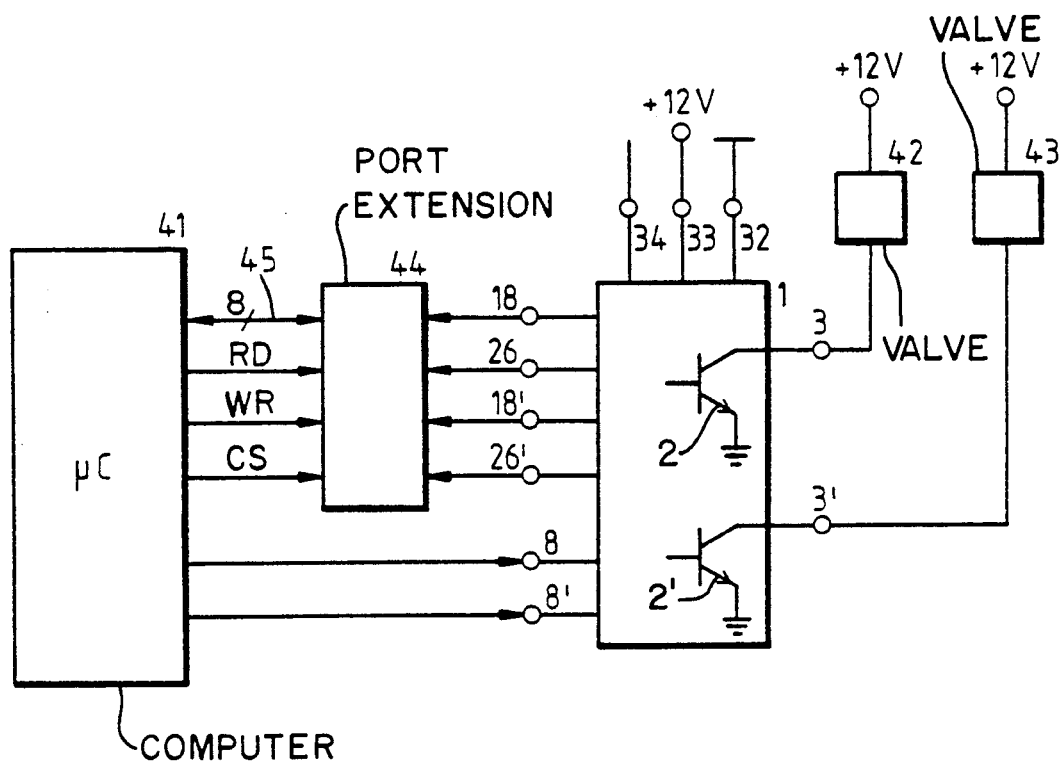
FIG. 2 is a block diagram of a control device having a switching arrangement in accordance with the invention.

FIG. 2 shows parts of a control device using the module 1 of FIG. 1. In this case, a microcomputer 41 is provided which produces control signals and feeds them via the inputs 8, 8' to the module 1. The outputs 3, 3' of the module are connected with injection valves 42, 43 to which there is also fed a voltage of +12 V, which voltage may be applied also to one of the terminals or connections 33, 34. Via connections 33, 32 the module is connected to a source of operating voltage and to ground potential. For the scanning of the error reports which, as described in connection with FIG. 1, are produced in the module 1, the outputs 18, 26, 18', 26' are connected with inputs of a port extension 44. Via a data line 45 and corresponding control lines RD WR and CS the computer 41 scans the condition of the outputs 18, 26, 18' and 26'. If error reports are present, suitable steps can be introduced corresponding to the program entered in the computer 41.

We claim:

1. A switching system suitable for driving automotive and automatic control devices and having a modular form, the system comprising
    at least one semiconductor switch for switching a load; and
    wherein each semiconductor switch comprises a multi-emitter transistor; and
    for each semiconductor switch, the system further comprises a short-circuit monitoring circuit connected to a first emitter of said transistor and an idle monitoring circuit connected to a second emitter of said transistor, each of said monitoring circuits signaling a faulty value of load current in said transistor.

2. A system according to claim 1, wherein upon a pulsating control of said at least one semiconductor switch and upon a resultant current flow through said at least one semiconductor switch, said idle monitoring circuit produces an output signal indicative of idling upon the occurrence of a value of said current flow which remains below a predetermined value during an entire conductive phase of said at least one semiconductor switch.

3. A system according to claim 2, wherein
    said multi-emitter transistor includes a third emitter connected to ground.

4. A system according to claim 1, wherein
    said idle monitoring circuit comprises a first threshold-value circuit connected to said at least one semiconductor switch for sensing current therein, a first low pass filter connected to an output of said first threshold valve circuit, and a first flip-flop connected to an output of said filter; and
    wherein said short-circuit monitoring circuit comprises a second threshold-value circuit connected to said at least one semiconductor switch for sensing current therein, a second low pass filter connected to an output of said second threshold-value circuit, and a second flip-flop connected to said second low pass filter.

5. A system according to claim 4, wherein
    said first flip-flop is resetable by an output signal of said first low pass filter and is set by a pulse control signal; and
    an output signal of said first flip-flop is combined with said pulse control signal to form an output signal of said idle monitoring circuit.

6. A system according to claim 4, wherein
    said second flip-flop is resetable by the output signal of said second low pass filter and is clock-controlled by a pulse control signal; and
    an output signal of said second flip-flop serves as an output signal of said short-circuit monitoring circuit.

7. A system according to claim 6, wherein
    said at least one semiconductor switch has a control electrode for receiving a control signal, said control signal inducing a current of flow through said at least one semiconductor switch; and
    an output signal of said second threshold value circuit controls a feeding of said control signal to said control electrode of said at least one semiconductor switch.

8. A system according to claim 6, wherein
    said at least one semiconductor switch has a control electrode for receiving a control signal, said control signal including a current of flow through said at least one semiconductor switch; and
    a further another output signal of said second flip-flop controls a feeding of said control signal to said control electrode of said at least one semiconductor switch.

9. A system according to claim 4 further comprising
    a power circuit connecting with each of said threshold-value circuits and with said transistor for adjusting operations of said threshold-value circuits and said transistor in accordance with a desired power level; and
    wherein said power circuit includes a power input terminal for enabling said system to be operative with input power in different ranges of voltage magnitude.

10. A system according to claim 9, wherein
    said at least one semiconductor switch has a control electrode for receiving a control signal, said control signal inducing a current of flow through said at least one semiconductor switch; and the amplitude of said control signal applied to said control electrode of said at least one semiconductor switch is dependent on the voltage of said input power.

11. A system according to claim 9, wherein threshold values to which said short circuit monitoring circuit and said idle monitoring circuit respond are dependent on the voltage of said input power.

12. A system according to claim 9, wherein a limiting voltage at said first and said second threshold value circuits for said at least one semiconductor switch is dependent on the voltage of said input power.

13. A system according to claim 1, further comprising a temperature sensor located in said module, an output signal of said sensor controlling said short-circuit monitoring circuits, wherein upon an exceeding of a predetermined temperature, each of said short-circuit monitoring circuits outputs an electric signal value indicating a short circuit in said load.

14. A switching system suitable for driving automotive and automatic control devices, comprising:

at least one semiconductor switching circuit for switching load current to a load, said switching circuit having a first branch and a second branch; and wherein, for each semiconductor switching circuit, the system further comprises a short circuit monitoring circuit connected to said first branch of said switching circuit for signaling a faulty value of the load current, and an idle monitoring circuit connected to said second branch of said switching circuit for signaling a faulty value of the load current.

* * * * *